(12) United States Patent
Pilo

(10) Patent No.: US 6,198,666 B1
(45) Date of Patent: Mar. 6, 2001

(54) CONTROL INPUT TIMING-INDEPENDENT DYNAMIC MULTIPLEXER CIRCUIT

(75) Inventor: Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/515,526

(22) Filed: Feb. 29, 2000

(51) Int. Cl.$^7$ ........................................ G11C 8/00
(52) U.S. Cl. ................ 365/189.02; 365/230.02; 365/189.05
(58) Field of Search .................. 365/189.02, 230.02, 365/189.05

(56) References Cited

U.S. PATENT DOCUMENTS

| | | |
|---|---|---|
| 4,811,296 | 3/1989 | Garde . |
| 5,228,134 | 7/1993 | MacWilliams et al. . |
| 5,293,603 | 3/1994 | MacWilliams et al. . |
| 5,559,453 | 9/1996 | Covino et al. . |
| 5,828,606 | 10/1998 | Mick . |
| 5,838,631 | 11/1998 | Mick . |
| 5,841,732 | 11/1998 | Mick . |
| 6,032,215 * | 2/2000 | Farmwald et al. .......... 365/189.02 X |

* cited by examiner

Primary Examiner—Huan Hoang
(74) Attorney, Agent, or Firm—McGuireWoods, LLP; Robert A. Walsh

(57) ABSTRACT

An output MUX for a high speed memory is provided with an interlock circuit to insure that only one data bit can be on the output line at a given time. A plurality of data lines are switched, one at a time, onto a single output line by switching transistors in response to one of a plurality of control inputs. A pair of cross-coupled NAND gates are connected to the output line to produce an LOCK signal whenever data is detected on the output line. The LOCK signal is logically NANDed with each of the control inputs prior to reaching the switching transistors. In this manner, the control signals are effectively locked out and not allowed to propagate through to the switching transistors while the output line is already being driven by data. As long as the LOCK signal remains active any of the control inputs may switch without causing any glitches or fails on the output line. When the active data line becomes inactive, a logic gate resets the pair of cross coupled NAND gates and disarms the LOCK signal in preparation for the next memory cycle MUXing. Thus, the window in which a control signal may transition is considerably broadened by the elimination of one of the timing prerequisites of the MUX control signals. As a result, these control signals may transition anytime prior to the array data for the fastest subarray and thus eliminate cycle time dependencies.

6 Claims, 4 Drawing Sheets

CONTROL INPUT TIMING-INDEPENDENT DYNAMIC MULTIPLEXER CIRCUIT

BACKGROUND OF THE INVENTION

1. Field of the Invention

The present invention generally relates to an output multiplexer (MUX) for a high speed memory and, more particularly, to an output MUX having an output interlock circuit which ensures that only one data signal can be present on the output line at a time regardless of whether or not a control signal for the next data cycle transitions during this same time.

2. Description of the Related Art

Static random access memory (SRAM) is a type of high speed memory wherein each bit is represented by the state of a circuit with two stable states. Such a "bistable" circuit can be built with four transistors (for maximum density) or six (for highest speed and lowest power). SRAM retains data bits in its memory as long as power is being supplied. Unlike dynamic RAM (DRAM), which stores bits in cells made up of a capacitor and a transistor, SRAM does not have to be periodically refreshed. Static RAM provides faster access to data but is more expensive than DRAM. SRAM is commonly used for a computer's level two (L2) cache memory. The function of the L2 cache is to stand between DRAM and a computer's central processing unit (CPU), offering faster access than DRAM.

SRAM memory cells are typically configured in arrays and addressable subarrays. An output multiplexer (MUX) receives the data from the SRAM subarrays and multiplexes the data onto the data bus for the CPU. Unfortunately, due to manufacturing considerations as well as the physical placement within the SRAM array, not all of the subarrays are accessible at the same speed. That is, some of the subarrays are accessible faster and some are slower than others. The array data therefore has non-uniform timing relations as compared to the SRAM clock due to a large skew associated with addressing the fastest and then the slowest subarrays in the memory.

These non-uniform timing relations result in a critical timing bottleneck the becomes more pervasive with the increasing speed of the memory device. This situation leaves a very small window for the MUX control inputs to transition between the reset of the slowest data and prior to the fastest data. Furthermore, it leaves little if any margin to increase frequency (i.e., the faster the frequency the smaller the timing window becomes).

SUMMARY OF THE INVENTION

It is therefore an object of the present invention to provide an output multiplexer(MUX) circuit to be placed between the SRAM array output and the CPU data bus to negotiate timing skews created by subarrays of differing speeds.

It is yet another object of the present invention to provide an output multiplexer which guarantees a single SRAM data on the output line at a given time even if the a control line for the next memory cycle transitions during this time without handshaking with the SRAM.

According to the invention an output MUX is provided with an interlock circuit to insure that only one data bit can be on the output line at a given time. A plurality of data lines are switched, one at a time, onto a single output line by switching transistors in response to one of a plurality of control inputs. A pair of cross-coupled NAND gates are connected to the output line to produce a LOCK signal whenever data is detected on the output line. The LOCK signal is logically NANDed with each of the control inputs prior to reaching the switching transistors. In this manner, the control signals are effectively locked out and not allowed to propagate through to the switching transistors while the output line is already being driven by data. A delay loop connected to the output line resets the output line via a pull-up transistor. Even when the output line is reset, the LOCK signal remains active (low) due to the pair of cross-coupled NAND gates. As long as the LOCK signal remains active any of the control inputs may switch without causing any glitches or fails on the output line. When the active data line becomes inactive, a logic gate resets the pair of cross coupled NAND gates and disarms the LOCK signal in preparation for the next memory cycle MUXing.

Thus, the window in which a control signal on the control line may transition is considerably broadened by the elimination of one of the timing prerequisites of the MUX control signals. As a result, these control signals may transition anytime prior to the array data for the fastest subarray and thus eliminate cycle time dependencies.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
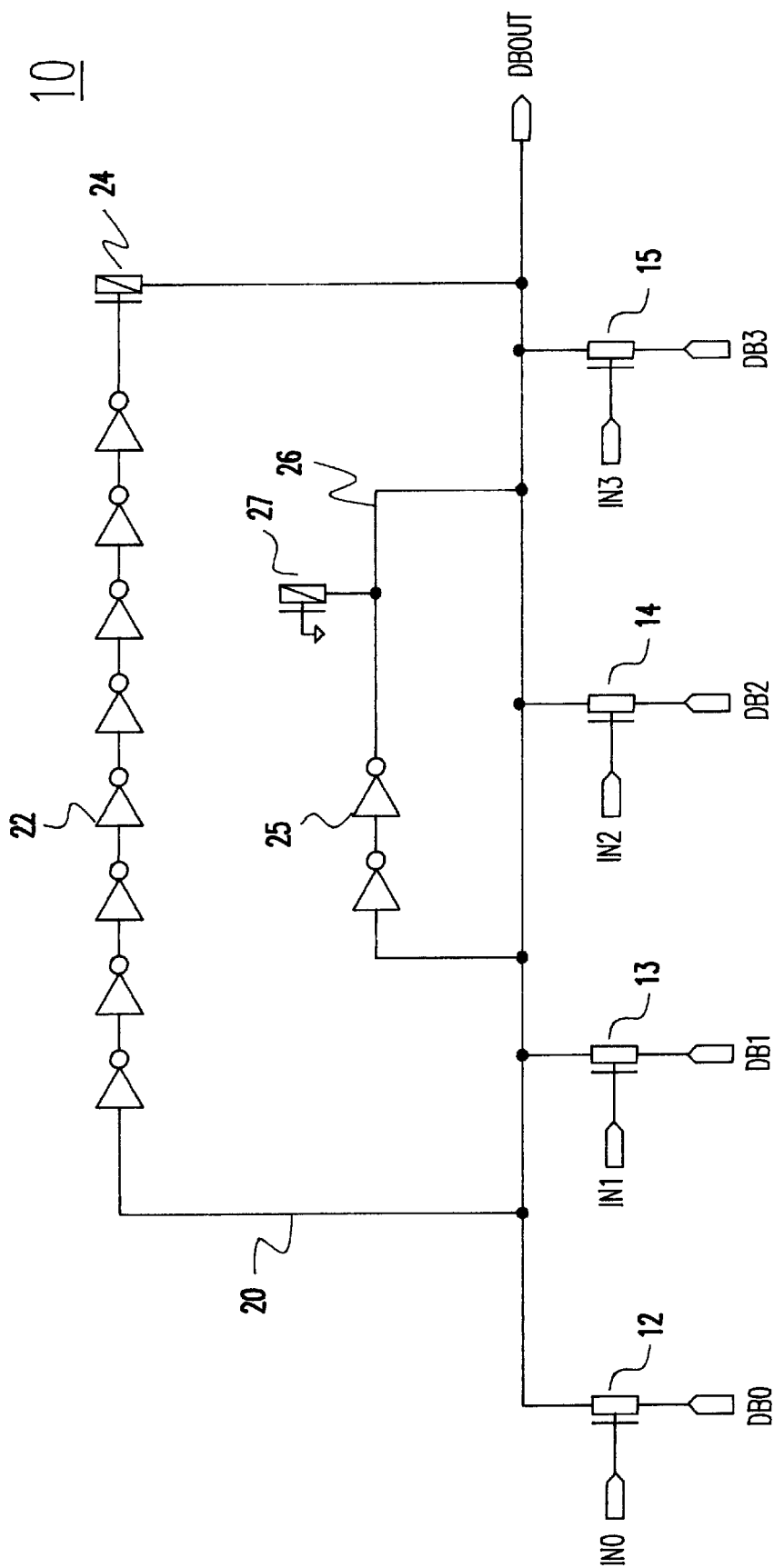
FIG. 1 is an output multiplexer circuit suitable for multiplexing data from a high speed memory array (e.g. SRAM) onto an output line.

Referring now to the drawings, and more particularly to FIG. 1, there is shown a dynamic output MUX 10 which can be placed between a memory device, such as a SRAM array (not shown), and a CPU (not shown). For purposes of illustration the MUX 10 shown is a 4:1 MUX suitable for a 16 MB memory device. However, it will be appreciated that this size is merely for illustrative purposes and is not intended to be limiting. A plurality of SRAM data lines DB0–DB3 are switched, one at a time, onto an output line DBout by switching transistors 12–15 in response to one of a plurality of control inputs IN0–IN3. For example, data signals DB0–DB3 pulse low whenever active. When a data is present on data line DB0, control input IN0 will cause switching transistor 12 to conduct thus placing the data of DB0 on the output line DBout. A latch circuit 26 comprising delay elements 25 and transistor 27 is provided to hold the data state of the data signal DB0 on the output line DBout. The data signal also propagates through a delay loop 20 comprising a plurality of delay elements 22. When the data reaches transistor 24, it begins to conduct pulling the output line DBout high causing the output line to reset in preparation for the next MUXing cycle.

Figure 2:
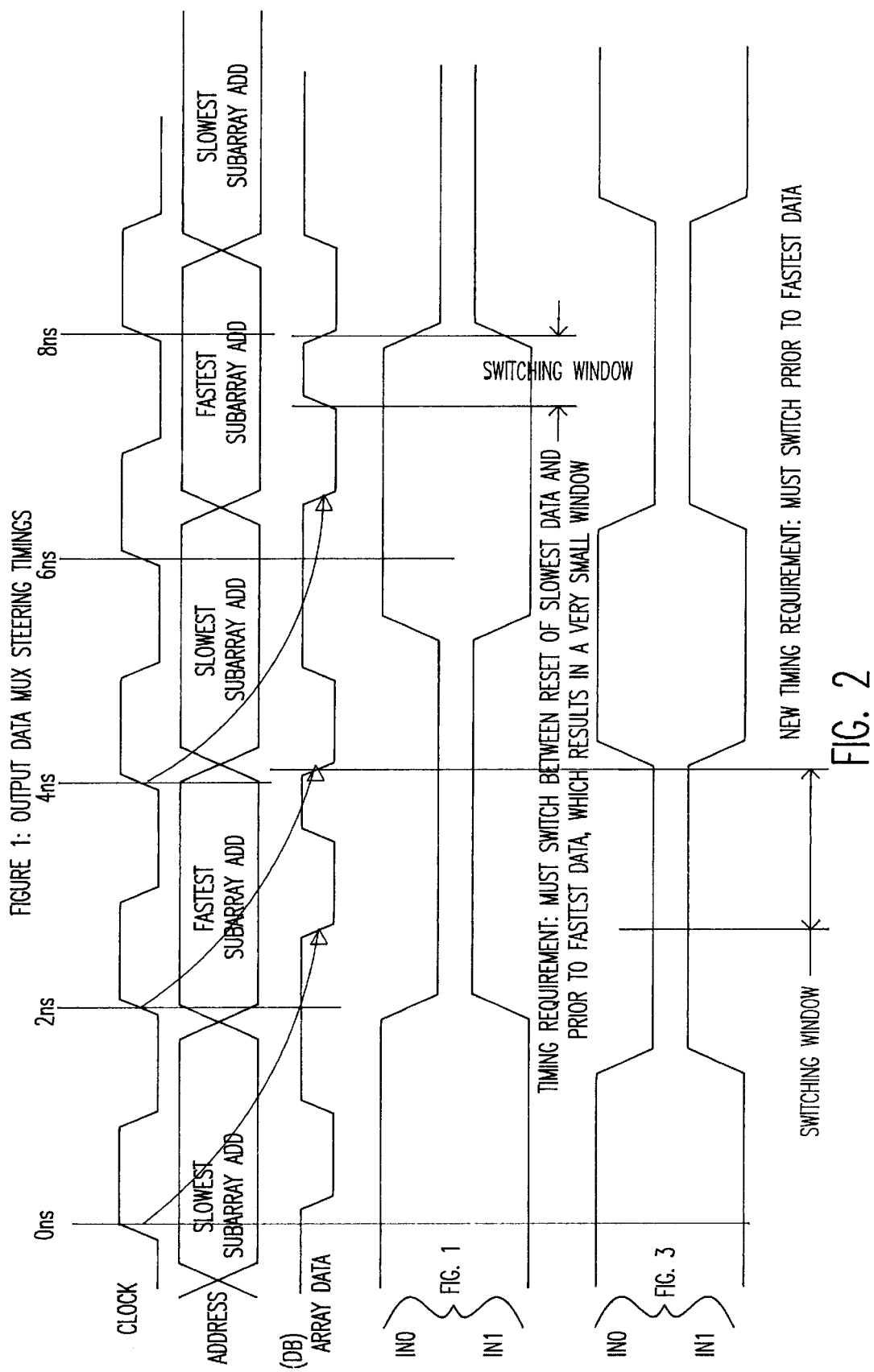
FIG. 2 is a timing diagram illustrating the timing skew between the SRAM clock, the fastest and slowest memory subarrays and the MUX control signals.

FIG. 2 is a timing diagram illustrating the timing relationships between the array data, control signals IN0–IN1, and the SRAM clock when accessing between addresses in the fastest and the slowest subarrays. As shown there is a skew between the SRAM clock and the array data when addressing between the fastest and the slowest subarrays. Referring to the timing diagrams for control signals IN0 and IN1 for the MUX shown in FIG. 1, in order to ensure that the there are no glitches on the output line DBout, the control signals IN0 and IN1 must transition between the reset of the slowest data and prior to the fastest data, which results in a short switching window which is difficult to guarantee.

Figure 3:
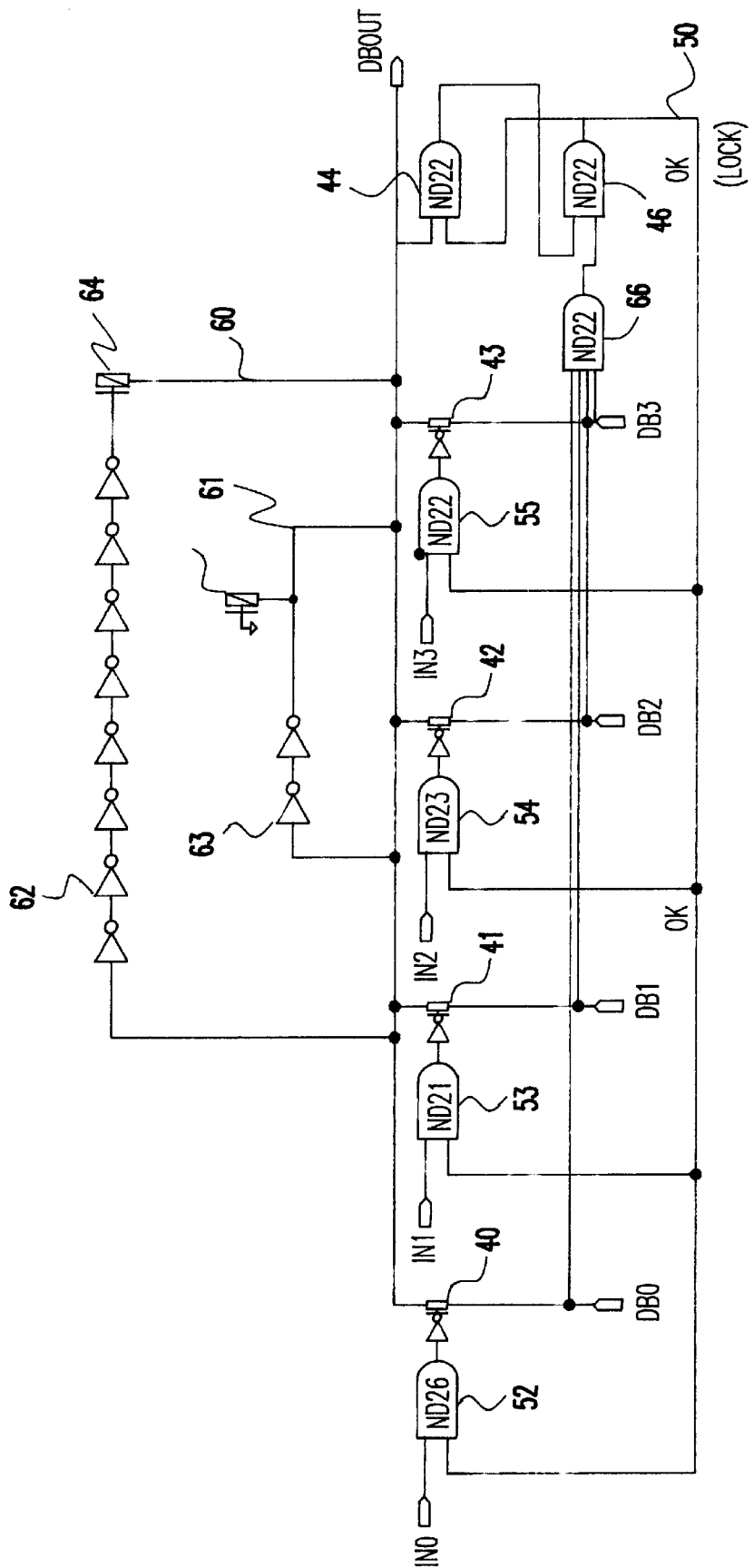
FIG. 3 is an output multiplexer with interlock circuit according to the present invention.

Referring now to FIG. 3, there is shown an improved output MUX according to the present invention comprising an interlock circuit that ensures that only one data bit can be on the output line at a given time with the only control signal timing requirement being that the control inputs IN0–IN3 switch prior to the data from the fastest subarray thus eliminating the requirement that the switch occur after the reset of the slowest subarray.

As shown in FIG. 3, a plurality of data lines DB0–DB3 are switched, one at a time, onto a single output line DBout by switching transistors 40–43 in response to one of a plurality of control inputs IN0–IN3. An interlock circuit comprising a pair of cross-coupled NAND gates, 44 and 46, is connected to the output line to produce a LOCK signal 50 whenever data is detected on the output line DBout. The LOCK signal 50 is logically NANDed by NAND gates 52–55 with each of the control inputs IN0–IN3 prior to reaching the switching transistors 40–43. In this manner, the control signals IN0–IN3 are effectively locked out and not allowed to propagate through to the switching transistors 40–43 while the output line DBout is already being driven by data. A delay loop 60 connected to the output line DBout comprises a plurality of delay elements 62 and uses the data signal to reset the output line DBout via a pull-up transistor 64. The delay elements 62 in delay loop 60 are chosen to provide a robust pulse width on the output, but not so wide that it collides with the DB signals (the delay loop 62 is responsible for providing the troughs of the DBout waveform shown in FIG. 4). A latch circuit 61 comprising delay elements 63 and transistor 67 is provided to hold the data state of the data signal DB0–DB3 on the output line DBout. Even when the output line DBout is reset, the LOCK signal 50 remains active (low) due to the pair of cross-coupled NAND gates 44 and 46. As long as the LOCK signal 50 remains active any of the control inputs may switch without causing any glitches or fails on the output line. When the active data line becomes inactive, a logic gate 66 connected to each of the data lines DB0–DB3 resets the pair of cross coupled NAND gates 44 and 46 and disarms the LOCK signal 50 in preparation for the next memory cycle MUXing.

Referring back to the timing diagram shown in FIG. 2, since the interlock circuit prevents any change of the control signals to be recognized while a data is already present on the output line DBout, it no longer matters if the control signals transition after the slowest data. Instead, the only condition needed to be met is that the control signals transition prior to the fastest data resulting in a much wider control signal transition window.

Figure 4:
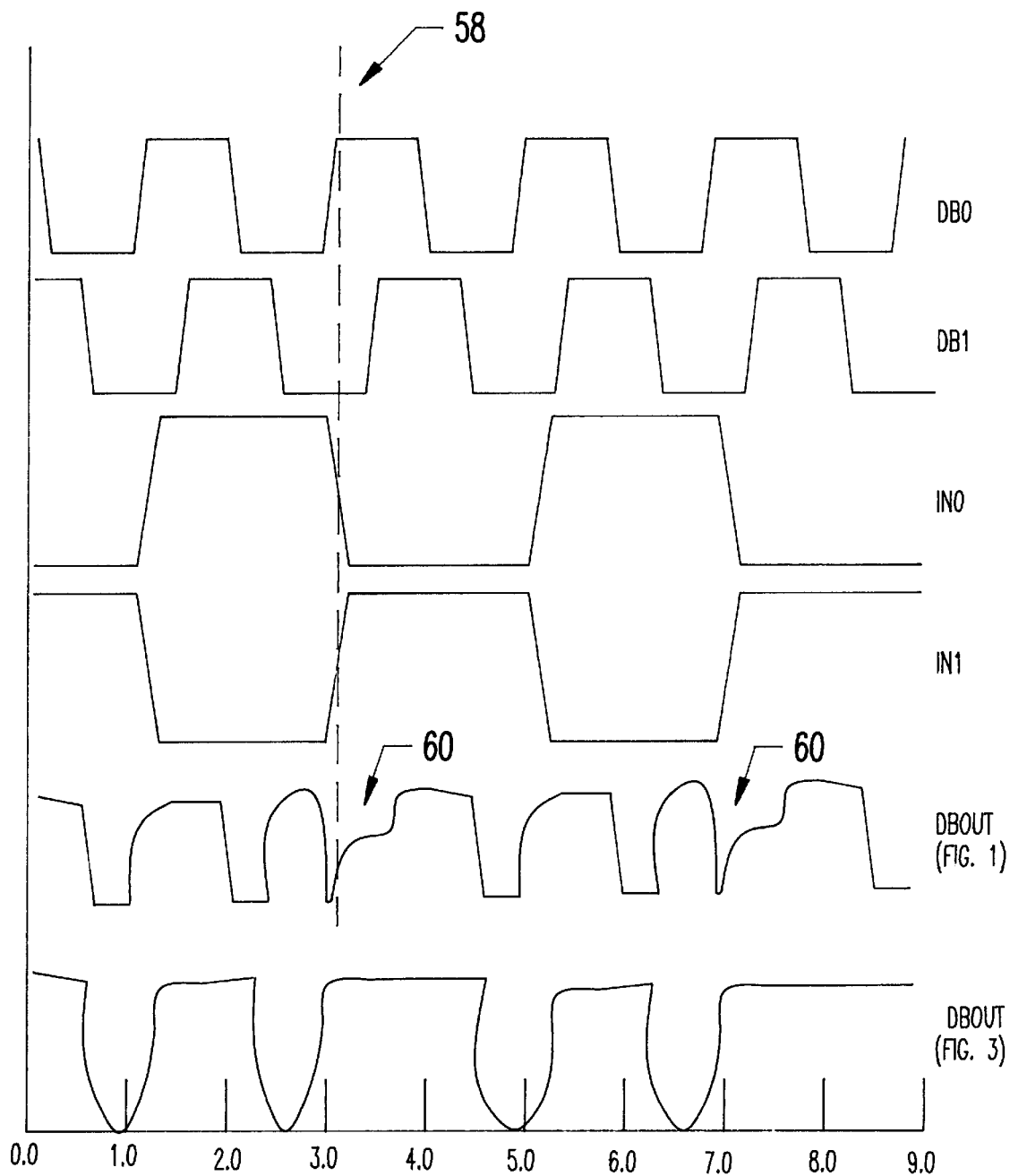
FIG. 4 is a timing diagram illustrating the outputs for the multiplexers shown in FIGS. 1 and 3 for the same input waveforms.

As shown in FIG. 4, data signals DB0 and DB1 are skewed relative to on anther. If IN0 and IN1 transition during a period 58 when both DB1 and DB0 are active (low)or are transitioning, a glitch 60 will appear in the output waveform DBout for the MUX shown in FIG. 1. However, referring to the bottom waveform, according to the present invention, the MUX having an interlock circuit allows IN0–IN3 to become active while the bus (any DB signal) is still active without generating a glitch since if the output of the circuit is active (DBout), the cross coupled NAND structure (44/46) blocks the input selection IN0–IN3 until the data bus (DB0–DB3) is not active (DB0–DB3 are high).

While the invention has been described in terms of a single preferred embodiment, those skilled in the art will recognize that the invention can be practiced with modification within the spirit and scope of the appended claims.

I claim:

1. A multiplexer having a plurality of data lines to be multiplexed onto a single output line, said multiplexer comprising:

a switch means for each of said data lines for connecting said data lines to said output line in response to a control signal;

an interlock circuit connected to said output line for detecting a data signal on said output line and producing a lock signal;

gate means for blocking said control signal to said switch means in response to said lock signal;

a latch circuit for holding a holding a data state on said output line;

a reset loop connected to said output line for resetting said output line; and a logic gate connected to each of said data lines for releasing said lock signal when no data on any of said data lines is detected.

2. A multiplexer as recited in claim 1, wherein said interlock circuit comprises a pair of cross-coupled logic gates.

3. A multiplexer as recited in claim 1 wherein said switching means comprises a switching transistor.

4. An output multiplexer (MUX) for a highspeed memory array, comprising:

a plurality of switching elements for connecting a plurality of data lines to a single output line;

an interlock circuit comprising a pair of cross-coupled gates connected to said output line for producing a lock signal whenever data is detected on said output line;

a plurality of control signal lines for activating said switching elements; and a plurality of logic gates each having an output connected to one of said plurality of switching elements and receiving as inputs said lock signal and one of said plurality of control signals, wherein a path between said control signal lines and said switching elements is blocked in the presence of said lock signal.

5. An output multiplexer (MUX) for a highspeed memory array as recited in claim 4, further comprising:

a logic gate connected between said interlock circuit and each of said plurality of data lines for releasing said lock signal when no data is present on any of said plurality of lines.

6. An output multiplexer (MUX) for a highspeed memory array as recited in claim 5, further comprising:

a latch circuit for holding a data state on said output line; and a delay loop connected to said output line for resetting said data line.

* * * * *